United States Patent
Lu et al.

(10) Patent No.: US 9,455,135 B2
(45) Date of Patent: Sep. 27, 2016

(54) METHOD FOR FABRICATING SEMICONDUCTOR DEVICE

(71) Applicant: UNITED MICROELECTRONICS CORP., Hsin-Chu (TW)

(72) Inventors: Chia-Lin Lu, Taoyuan County (TW); Chun-Lung Chen, Tainan (TW); Kun-Yuan Liao, Hsin-Chu (TW); Feng-Yi Chang, Tainan (TW); En-Chiuan Liou, Tainan (TW); Chieh-Te Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/562,768

(22) Filed: Dec. 7, 2014

(65) Prior Publication Data

US 2016/0163532 A1    Jun. 9, 2016

(51) Int. Cl.
| | |
|---|---|
| *H01L 21/302* | (2006.01) |
| *H01L 21/02* | (2006.01) |
| *H01L 21/311* | (2006.01) |
| *H01L 21/033* | (2006.01) |
| *H01L 21/027* | (2006.01) |

(52) U.S. Cl.
CPC ....... *H01L 21/0206* (2013.01); *H01L 21/0276* (2013.01); *H01L 21/02186* (2013.01); *H01L 21/0332* (2013.01); *H01L 21/31144* (2013.01)

(58) Field of Classification Search
CPC ............ H01L 21/0206; H01L 21/02186; H01L 21/0276; H01L 21/0332; H01L 21/3114; H01L 21/31144

USPC ................ 438/197, 199, 238, 652, 689–700; 216/37, 67
See application file for complete search history.

(56) References Cited

U.S. PATENT DOCUMENTS

| | | | |
|---|---|---|---|
| 6,429,067 B1 * | 8/2002 | Liu ................. | H01L 21/823842 257/E21.637 |
| 7,700,494 B2 | 4/2010 | Balasubramaniam et al. | |
| 7,807,064 B2 | 10/2010 | Kim et al. | |
| 8,043,957 B2 | 10/2011 | Tada et al. | |
| 8,906,760 B2 * | 12/2014 | Ranjan .............. | H01L 21/02112 438/197 |
| 2014/0349452 A1 * | 11/2014 | Wang .............. | H01L 21/823468 438/238 |
| 2014/0361352 A1 * | 12/2014 | Hung ................ | H01L 21/28008 257/288 |

OTHER PUBLICATIONS

Hung, Title of Invention: Method for Forming Semiconductor Device, U.S. Appl. No. 14/514,374, filed Oct. 14, 2014.

* cited by examiner

*Primary Examiner* — Duy Deo
*Assistant Examiner* — Maki Angadi
(74) *Attorney, Agent, or Firm* — Winston Hsu; Scott Margo

(57) ABSTRACT

A method for fabricating semiconductor device is disclosed. The method includes the steps of: providing a substrate having at least a gate structure thereon and an interlayer dielectric (ILD) layer around the gate structure; forming a hard mask on the gate structure and the ILD layer; forming a first patterned mask layer on the hard mask; using the first patterned mask layer to remove part of the hard mask for forming a patterned hard mask; and utilizing a gas to strip the first patterned mask layer while forming a protective layer on the patterned hard mask, wherein the gas is selected from the group consisting of $N_2$ and $O_2$.

8 Claims, 5 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of forming a protective layer on TiN hard mask while stripping an organic mask layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, integration of metal gate and contact plugs still faces some issues in conventional FinFET fabrication. For instance, issues such as presence of residue and interlayer dielectric (ILD) layer roughness often arise during formation of the contact plugs. Hence, how to improve the current FinFET fabrication for resolving these issues has become an important task in this field.

SUMMARY OF THE INVENTION

According to a preferred embodiment of the present invention, a method for fabricating semiconductor device is disclosed. The method includes the steps of: providing a substrate having at least a gate structure thereon and an interlayer dielectric (ILD) layer around the gate structure; forming a hard mask on the gate structure and the ILD layer; forming a first patterned mask layer on the hard mask; using the first patterned mask layer to remove part of the hard mask for forming a patterned hard mask; and utilizing a gas to strip the first patterned mask layer while forming a protective layer on the patterned hard mask, wherein the gas is selected from the group consisting of $N_2$ and $O_2$.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
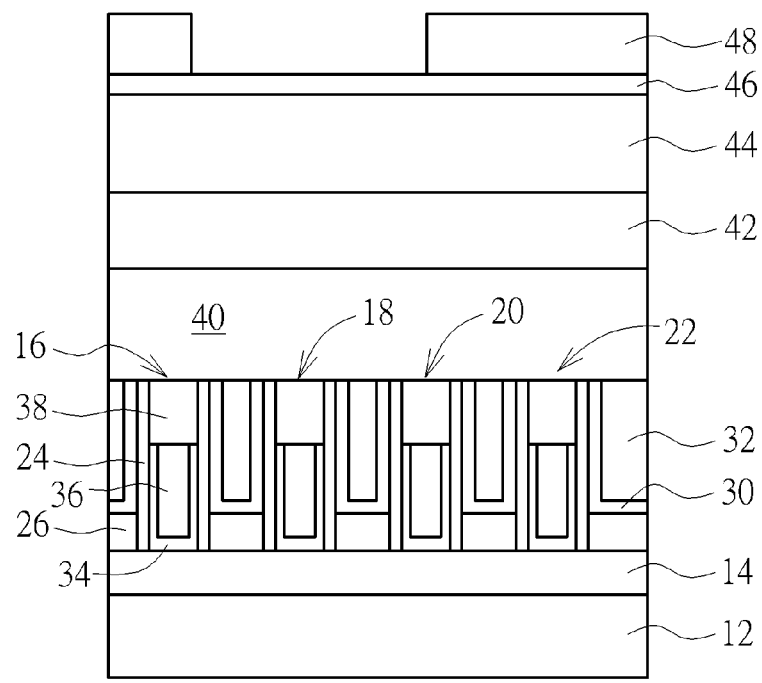
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12.

At least a first fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of gate structures, such as metal gates 16, 18, 20, 22 are formed on part of the fin-shaped structure 14. It should be noted that even though only four metal gates are disclosed in this embodiment, the quantity of the metal gates is not limited to four, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer could be eliminated.

The fabrication of the metal gates 16, 18, 20, 22 could be accomplished by a gate first process, a high-k first approach from gate last process, or a high-k last approach from gate last process. Since this embodiment pertains to a high-k first approach, dummy gate s (not shown) composed of high-k dielectric layer and polysilicon material could be first formed on the fin-shaped structure 14 and the insulating layer, and a spacer 24 is formed on the sidewall of the dummy gates. A source/drain region and/or epitaxial layer 26 are then formed on the fin-shaped structure 14 and/or substrate 12 adjacent to two sides of the spacer 24, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gate into a metal gate. The RMG process could be accomplished by first performing a selective dry etching or wet etching process, such as using etchants including ammonium hydroxide ($NH_4OH$) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surface of the U-shaped work function layer 34 and low resistance metal layer 36 is even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungstenaluminide (WAl), tantalumaluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Part of the metal gates 16, 18, 20, 22, such as part of the work function metal layer 34 and low resistance metal layer 36 are then removed by etching process and a cap layer 38 composed of material such as silicon nitride is formed on the metal gates 16, 18, 20, 22 so that the top surface of the cap layer 38 is even with the ILD layer 32.

Next, an oxide layer 40 is formed on the metal gates 16, 18, 20, 22 and the ILD layer 32, and a hard mask 42, a mask layer 44, a silicon-containing hard mask bottom anti-reflective coating (SHB) 46, and a patterned resist 48 are formed sequentially on the oxide layer 40. In this embodiment, the hard mask 42 is composed of TiN or TaN, and the mask layer 44 is composed of an organic dielectric layer (ODL), but not limited thereto.

Figure 2:
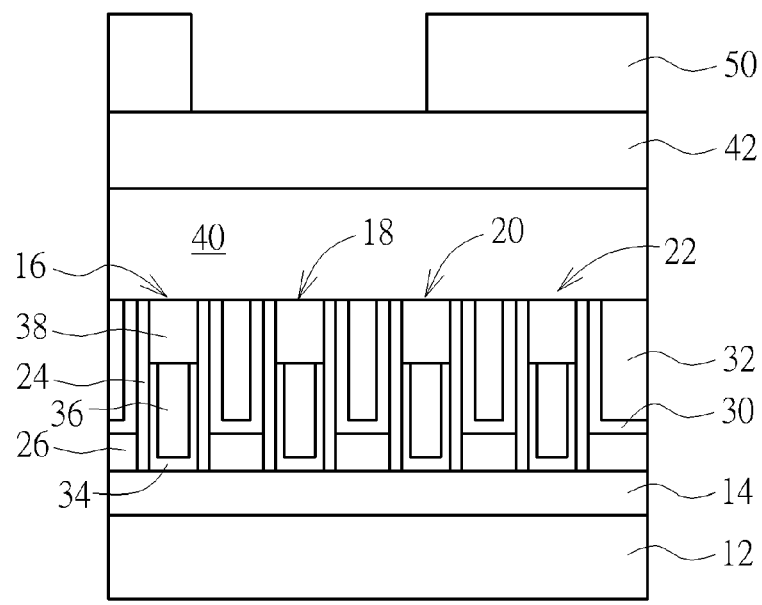

Next, as shown in FIG. 2, an etching process is conducted by using the patterned resist 48 as mask to remove part of the SHB 46 and part of the mask layer 44 and stop on the hard mask 42. This forms a patterned mask layer 50 on the hard mask 42 and the patterned resist 48 and SHB 46 are then stripped thereafter.

Figure 3:
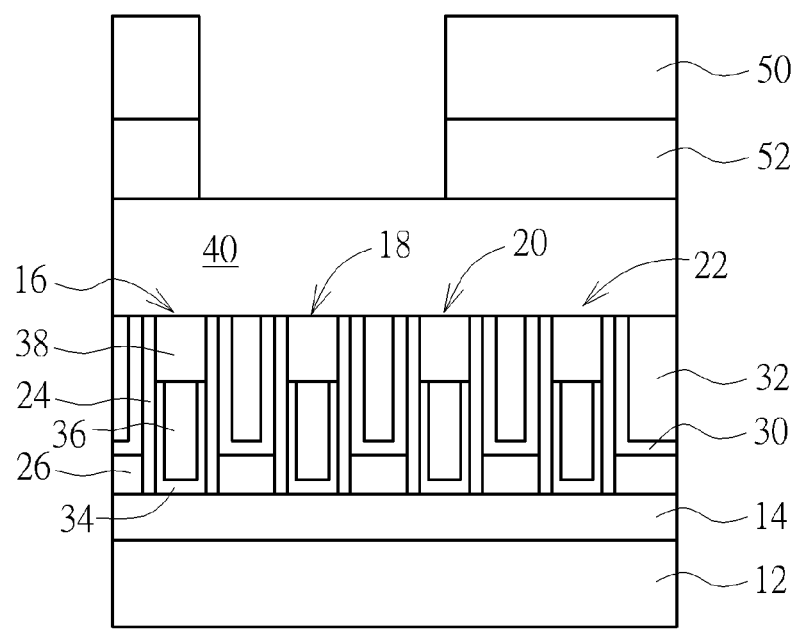

Next, as shown in FIG. 3, another etching process is conducted by using the patterned mask layer 50 as mask to remove part of the hard mask 42 for forming a patterned hard mask 52.

Figure 4:
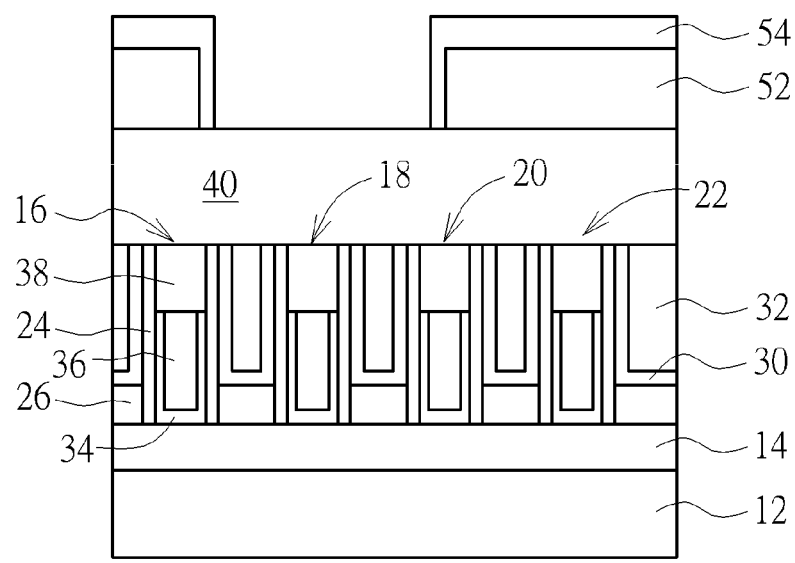

Next, as shown in FIG. 4, a gas is used to strip the patterned mask layer 50 while forming a protective layer 54 on the patterned hard mask 52. According to a preferred embodiment of the present invention, the gas used for stripping the patterned mask layer 50 is selected from the group consisting of $N_2$ and $O_2$, and in the case of using a patterned hard mask 52 composed of TiN, the protective layer 54 formed during the stripping of patterned mask layer 50 is preferably composed of TiON or $TiO_X$.

Figure 5:
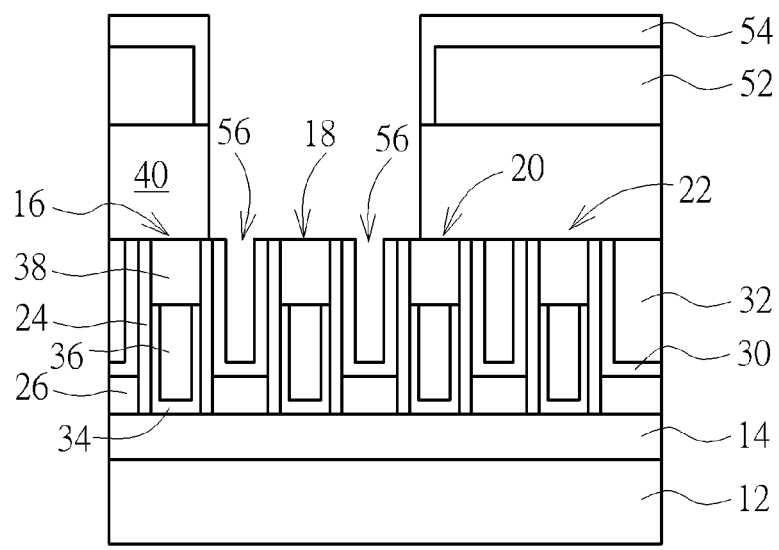

Next, as shown in FIG. 5, the patterned hard mask 52 and the protective layer 54 are used as mask to remove part of the oxide layer 40 and part of the ILD layer 32 for forming a plurality of openings 56 adjacent to the gate structures 16, 18, 20, 22. After the openings 56 are formed, conductive material could then be filled into the openings 56 for forming contact plugs. This completes the fabrication of a semiconductor device according to a preferred embodiment of the present invention.

Figure 6:
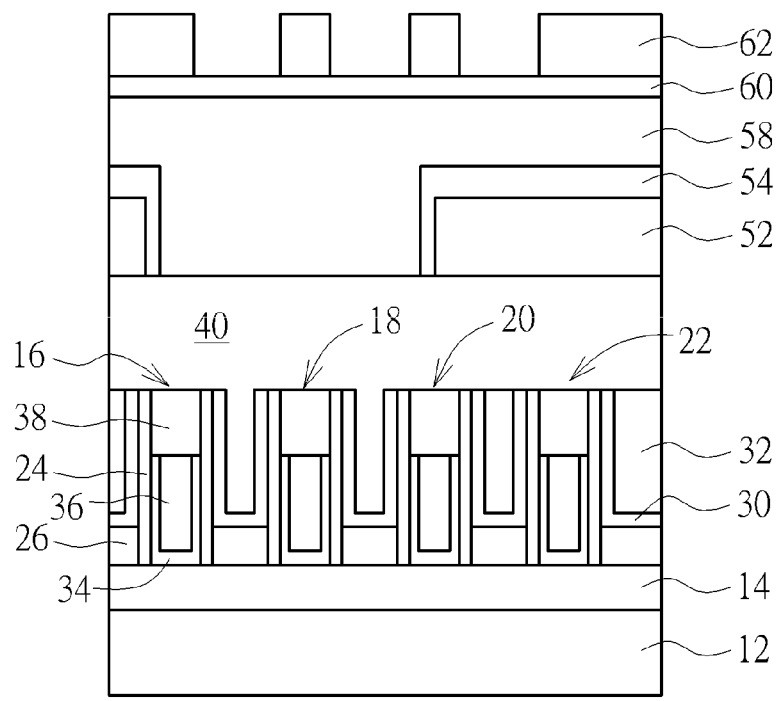
FIGS. 6-8 illustrate a method for fabricating semiconductor device according to an embodiment of the present invention.

In addition to the approach of forming openings shown in FIG. 5, it would also be desirable to perform addition pattern transfer process for forming openings adjacent to the gate structures according to another embodiment of the present invention. For instance, as shown in FIG. 6, after stripping the patterned mask layer 50 and forming protective layer 54 on the patterned hard mask 52 as shown in FIG. 4, an ODL 58 could be formed on the oxide layer 40 and the protective layer 54, and a SHB 60 and patterned resist 62 are formed on the ODL 58 thereafter.

Figure 7:
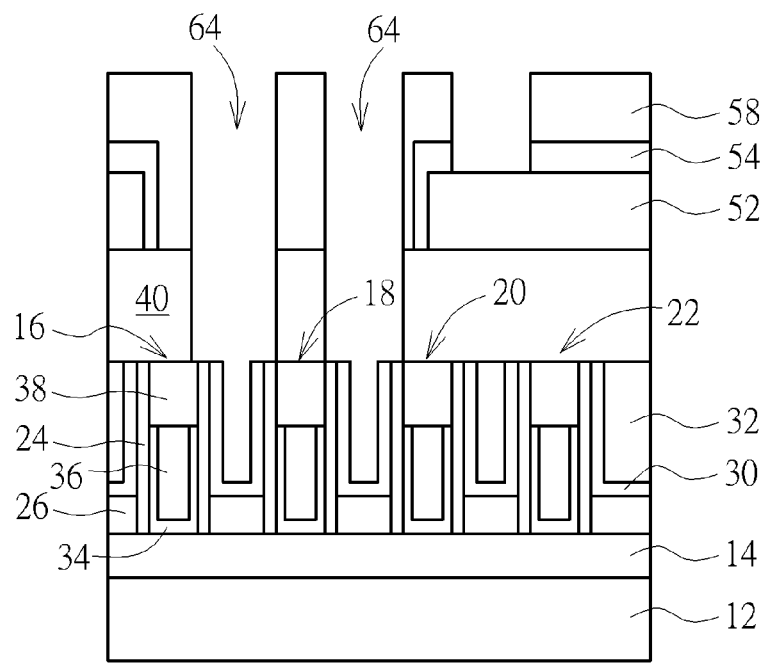

Next, as shown in FIG. 7, an etching process is conducted by using the patterned resist 62 as mask to remove part of the SHB 60, part of the ODL 58, part of the oxide layer 40, and part of the ILD layer 32 for forming a plurality of openings 64.

Figure 8:
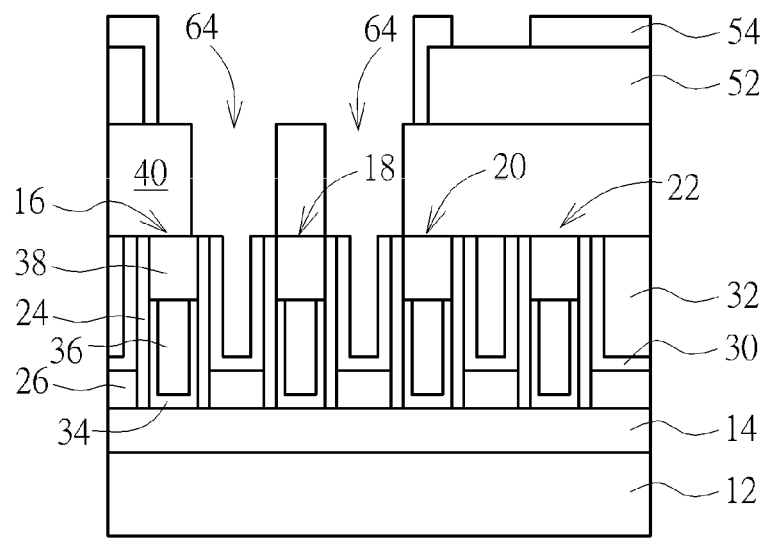

Next, as shown in FIG. 8, the patterned resist 62, the SHB 60, and the ODL 58 are stripped, and conductive material could then be filled into the openings 64 for forming contact plugs. This completes the fabrication of a semiconductor device according to another embodiment of the present invention.

Figure 9:
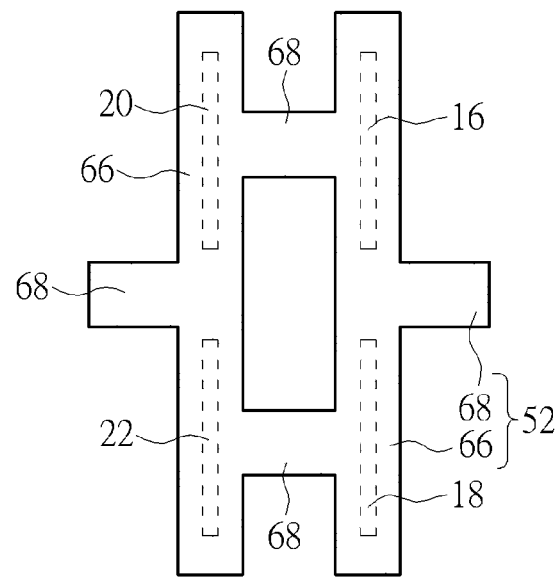
FIGS. 9-10 illustrate top views of a semiconductor device fabricated through processes disclosed in FIGS. 1-4 according to an embodiment of the present invention.
Figure 10:
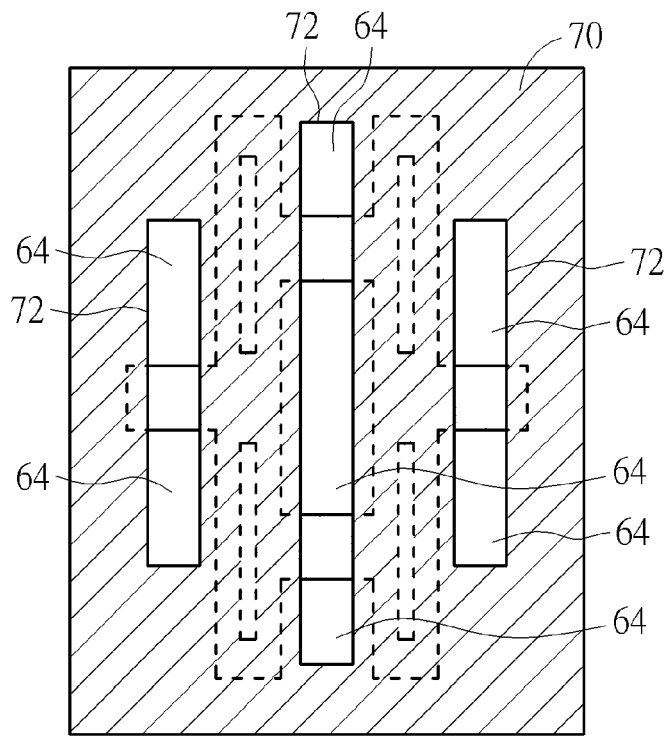

Referring to FIGS. 9-10, FIGS. 9-10 illustrate top views of a semiconductor device fabricated through processes disclosed in FIGS. 1-4 according to an embodiment of the present invention. As shown in FIG. 9, the patterned hard mask 52 of this embodiment preferably includes a first pattern 66 and a second pattern 68, in which the first pattern 66 includes vertical patterns covering the gate structures 16, 18, 20, 22 entirely while the second pattern 68 includes horizontal patterns connecting the vertical patterns.

Next, as shown in FIG. 10, a second patterned mask layer 70 is formed on the patterned hard mask 52, in which the second patterned mask layer 70 preferably includes at least a slot opening 72 exposing the second pattern 68 of the patterned hard mask 52. In this embodiment, three corresponding slot openings 72 are formed in the second patterned mask layer 70 for exposing the second pattern 68, in which the slot openings 72 are further divided into openings 64 corresponding to the openings 64 formed in FIG. 7 when the second patterned mask layer 70 overlaps the patterned hard mask layer 52.

Overall, the present invention first forms a hard mask preferably composed of TiN on gate structures and ILD layer, forms a patterned mask layer preferably composed of dielectric material on the hard mask, uses the patterned mask layer to remove part of the hard mask for forming a patterned hard mask, and then using a gas selected from the group consisting of $N_2$ and $O_2$ to strip the patterned mask layer while forming a protective layer on the patterned hard mask. According to a preferred embodiment of the present invention, the protective layer could be utilized to protect the surface of TiN hard mask, enhance quiescent time (Q-time) of the process, and maintain overall function of the hard mask.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:

providing a substrate having at least a gate structure thereon, a cap layer on the gate structure, and an interlayer dielectric (ILD) layer around the gate structure and the cap layer, wherein a top surface of the cap layer is even with a top surface of the ILD layer;

forming a hard mask on the cap layer and the ILD layer;

forming a first patterned mask layer on the hard mask;

using the first patterned mask layer to remove part of the hard mask for forming a patterned hard mask; and utilizing a gas to strip the first patterned mask layer while forming a protective layer on the patterned hard mask, wherein the gas is selected from the group consisting of $N_2$ and $O_2$.

2. The method of claim 1, wherein the hard mask comprises TiN.

3. The method of claim 2, wherein the protective layer comprises TiON or $TiO_x$.

4. The method of claim 1, wherein the first patterned mask layer comprises an organic dielectric layer (ODL).

5. The method of claim 1, further comprising:

forming an oxide layer on the gate structure and the ILD layer;

forming the hard mask and the first patterned mask layer on the oxide layer;

stripping the first patterned mask layer and forming the protective layer on the patterned hard mask; and using the patterned hard mask and the protective layer to remove part of the oxide layer and part of the ILD layer for forming a plurality of openings adjacent to the gate structure.

6. The method of claim 1, further comprising:

forming an oxide layer on the gate structure and the ILD layer;

forming the hard mask and the first patterned mask layer on the oxide layer;

stripping the first patterned mask layer and forming the protective layer on the patterned hard mask;

forming an ODL on the oxide layer and the protective layer;

forming a silicon-containing hard mask bottom anti-reflective coating (SHB) on the ODL;

using a patterned resist to remove part of the SHB, part of the ODL, part of the oxide layer, and part of the ILD layer for forming a plurality of openings; and stripping the patterned resist, the SHB, and the ODL.

7. The method of claim 1, wherein the patterned hard mask comprises a first pattern and a second pattern, and the first pattern covers the gate structure entirely.

8. The method of claim 7, further comprising:

forming a second patterned mask layer on the patterned hard mask, wherein the second patterned mask layer comprises at least a slot opening exposing the second pattern of the patterned hard mask.

\* \* \* \* \*